(12) United States Patent
Kitagawa et al.

(10) Patent No.: US 9,111,966 B2
(45) Date of Patent: Aug. 18, 2015

(54) SUBSTRATE PROCESSING APPARATUS AND SUBSTRATE PROCESSING METHOD

(71) Applicants: Hiroaki Kitagawa, Kyoto (JP); Katsuhiko Miya, Kyoto (JP)

(72) Inventors: Hiroaki Kitagawa, Kyoto (JP); Katsuhiko Miya, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 313 days.

(21) Appl. No.: 13/630,833

(22) Filed: Sep. 28, 2012

(65) Prior Publication Data
US 2013/0074873 A1 Mar. 28, 2013

(30) Foreign Application Priority Data

Sep. 28, 2011 (JP) ................................. 2011-212217
Mar. 15, 2012 (JP) ................................. 2012-058247

(51) Int. Cl.
 *H01L 21/304* (2006.01)
 *B08B 1/00* (2006.01)
 *H01L 21/67* (2006.01)

(52) U.S. Cl.
CPC ........ *H01L 21/67028* (2013.01); *H01L 21/304* (2013.01); *H01L 21/67132* (2013.01); *B08B 1/00* (2013.01); *B08B 1/001* (2013.01); *B08B 1/008* (2013.01)

(58) Field of Classification Search
USPC ....................................... 15/3, 97.1, 100, 102
See application file for complete search history.

(56) References Cited

U.S. PATENT DOCUMENTS

| | | | |
|---|---|---|---|
| 5,690,749 A | 11/1997 | Lee | 134/6 |
| 2001/0054210 A1* | 12/2001 | Matsuno et al. | 15/102 |
| 2008/0121335 A1 | 5/2008 | Kiuchi et al. | 156/85 |
| 2008/0271274 A1* | 11/2008 | Kordic et al. | 15/102 |
| 2009/0250077 A1 | 10/2009 | Harano et al. | 134/1 |

FOREIGN PATENT DOCUMENTS

| | | | |
|---|---|---|---|
| JP | 63-48678 | | 3/1988 |
| JP | 6-232108 | * | 8/1994 |
| JP | 7-74137 | | 3/1995 |
| JP | 7-271049 | * | 10/1995 |
| JP | 8-10721 | * | 1/1996 |
| JP | 8-88207 | | 4/1996 |
| JP | 9-260326 A | | 10/1997 |
| JP | 10-197853 | | 7/1998 |
| JP | 2001-319906 A | | 11/2001 |
| JP | 2004-47976 | * | 2/2004 |
| JP | 2007-322633 | * | 12/2007 |
| JP | 2008-109096 | * | 5/2008 |

(Continued)

OTHER PUBLICATIONS

Office Action issued Sep. 27, 2013 corresponding to the Korean Patent Application No. 10-2012-0090631 (5 pages).

(Continued)

*Primary Examiner* — Mark Spisich
(74) *Attorney, Agent, or Firm* — Ostrolenk Faber LLP (57) ABSTRACT

A substrate processing apparatus comprising: a substrate holder which holds a substrate having a pattern formed in a surface of the substrate in a predetermined positional relationship with a reference indicator of the substrate; and a cleaner which abuts an adhesive member on the surface of the substrate which is held by the substrate holder and peels off the adhesive member along the surface of the substrate in a peeling direction which is not at right angle to a direction of the pattern, thereby cleaning the surface of the substrate.

12 Claims, 8 Drawing Sheets

(56) References Cited

FOREIGN PATENT DOCUMENTS

| | | |
|---|---|---|
| TW | 200717629 | 5/2007 |
| TW | 200830355 | 7/2008 |

OTHER PUBLICATIONS

Office Action issued Jun. 30, 2014 corresponding to the Taiwanese Patent Application No. 101134351 (4 pages).

* cited by examiner

ANGLE θ TO PATTERN=0°

FIG. 5B

ANGLE θ TO PATTERN=90°

FIG. 6A

| ANGLE TO PATTERN | PARALLEL (0°) | 45° | VERTICALITY (90°) |
|---|---|---|---|
| PRE(%) | 100 | 99.0 | 80.5 |
| DAMAGE (PIECE/FIELD) | 0.00 | 0.00 | 1.00 |

FIG. 6B

| ANGLE TO PATTERN | PARALLEL (0°) | 20° | 45° | 70° | VERTICALITY (90°) |
|---|---|---|---|---|---|
| PRE(%) | 100 | 100 | 99.0 | 96.6 | 88.6 |
| DAMAGE (PIECE/FIELD) | 0.00 | 0.00 | 0.00 | 0.00 | 0.50 |

SUBSTRATE PROCESSING APPARATUS AND SUBSTRATE PROCESSING METHOD

CROSS REFERENCE TO RELATED APPLICATION

The disclosure of Japanese Patent Applications enumerated below including specifications, drawings and claims is incorporated herein by reference in its entirety:
No. 2011-212217 filed Sep. 28, 2011; and
No. 2012-058247 filed Mar. 15, 2012.

BACKGROUND OF THE INVENTION

1. Field of the Invention

The present invention relates to a technique of cleaning a surface of a substrate, such as a semiconductor wafer, a glass substrate for photo mask, a glass substrate for liquid crystal display, a glass substrate for plasma display and a substrate for optical disc, by abutting an adhesive member on the surface of the substrate and thereafter peeling off the adhesive member.

2. Description of the Related Art

Figure 1A:
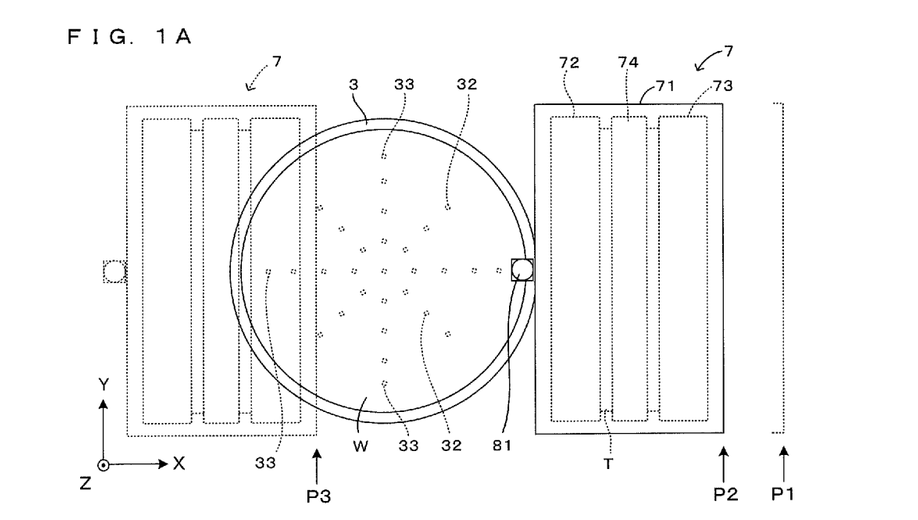
FIGS. 1A and 1B are drawings of the substrate processing apparatus according to the first embodiment of the invention.
Figure 1B:
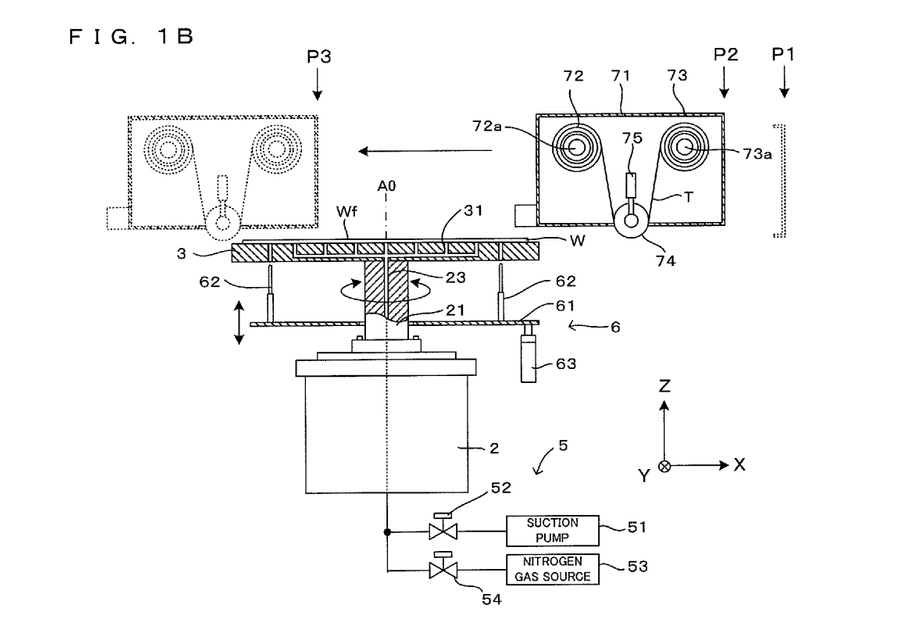

Among the various types of techniques for removal of an adhering foreign matter such as particles from a surface of a substrate is the technique disclosed in JP-A-63-48678, i.e., the so-called peel-off cleaning technique which uses an adhesive member (FIG. 1). In the apparatus described in this publication, an adhesive belt is wound around a pressure roller and while the pressure roller is pressed against the surface of the substrate, the adhesive belt moves in a circle. Hence, at the position where the pressure roller is pressed toward the surface of the substrate, the adhesive belt contacts the surface of the substrate and accordingly captures an adhering foreign matter adhering to the surface of the substrate, and as the belt moves, the adhesive belt is peeled off from the surface of the substrate while carrying the adhering foreign matter. The adhering foreign matter is thus removed from the surface of the substrate, thereby cleaning the surface of the substrate.

SUMMARY OF THE INVENTION

By the way, when the peel-off cleaning technique is applied to a substrate a surface of which seats a pattern, the rate of removal of an adhering foreign matter is important of course, and further, suppression of damage such as destruction of a pattern, namely, the damage suppression characteristic is very important. However, both the removal rate and the damage suppression characteristic have heretofore been unstable during cleaning of a substrate seating a pattern with the conventional peel-off cleaning technique. That is, the removal rate and the rate of damage occurrence greatly change every time cleaning is performed, which is a major practical problem.

The invention was made in light of the problem described above, and therefore, an object of the invention is to stably attain a favorable removal rate for removing an adhering foreign matter and an excellent damage suppression characteristic when using a substrate processing technique according to which an adhesive member is abutted on a surface of a substrate in which a pattern is formed and thereafter peeled off, thereby removing an adhering foreign matter from the surface of the substrate.

A substrate processing apparatus according to a first aspect of the invention comprises: a substrate holder which holds a substrate having a pattern formed in a surface of the substrate in a predetermined positional relationship with a reference indicator of the substrate; and a cleaner which abuts an adhesive member on the surface of the substrate which is held by the substrate holder and peels off the adhesive member along the surface of the substrate in a peeling direction which is not at right angle to a direction of the pattern, thereby cleaning the surface of the substrate.

A substrate processing method according to a second aspect of the invention comprises the steps of: holding a substrate which has a pattern formed in a surface of the substrate in a predetermined positional relationship with a reference indicator of the substrate by a substrate holder; abutting an adhesive member on the surface of the substrate held by the substrate holder; and peeling the adhesive member along the surface of the substrate in a peeling direction which is not at right angle to a direction of the pattern, thereby cleaning the surface of the substrate.

In the configuration according to the invention (the substrate processing apparatus and the substrate processing method), a surface of a substrate is cleaned as an adhesive member abutting on the surface of the substrate is peeled off along the surface of the substrate, in the event that a pattern is formed in the surface of the substrate, depending upon the relationship between the direction of the pattern and the peeling direction relative to each other, the rate of removal of an adhering foreign matter from the surface of the substrate and the damage suppressing characteristic for suppressing damage to the pattern may greatly vary. This is findings which the inventor of the invention obtained, and accordingly, the following configuration according to the invention based upon the findings aims at stabilization of the removal rate and the damage suppression characteristic. In short, according to the invention, the adhesive member is peeled off along the surface of the substrate in a direction which is not at right angle with respect to the direction of the pattern. The surface of the substrate is therefore cleaned at an excellent removal rate for removing an adhering foreign matter and with a favorable damage suppression characteristic.

As described above, since the adhesive member abutting on the surface of the substrate is peeled off in a direction which is not at right angle to a direction of the pattern, it is possible to stably attain an excellent removal rate of removing the adhering foreign matter and a favorable damage suppression characteristic.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

Figure 2:
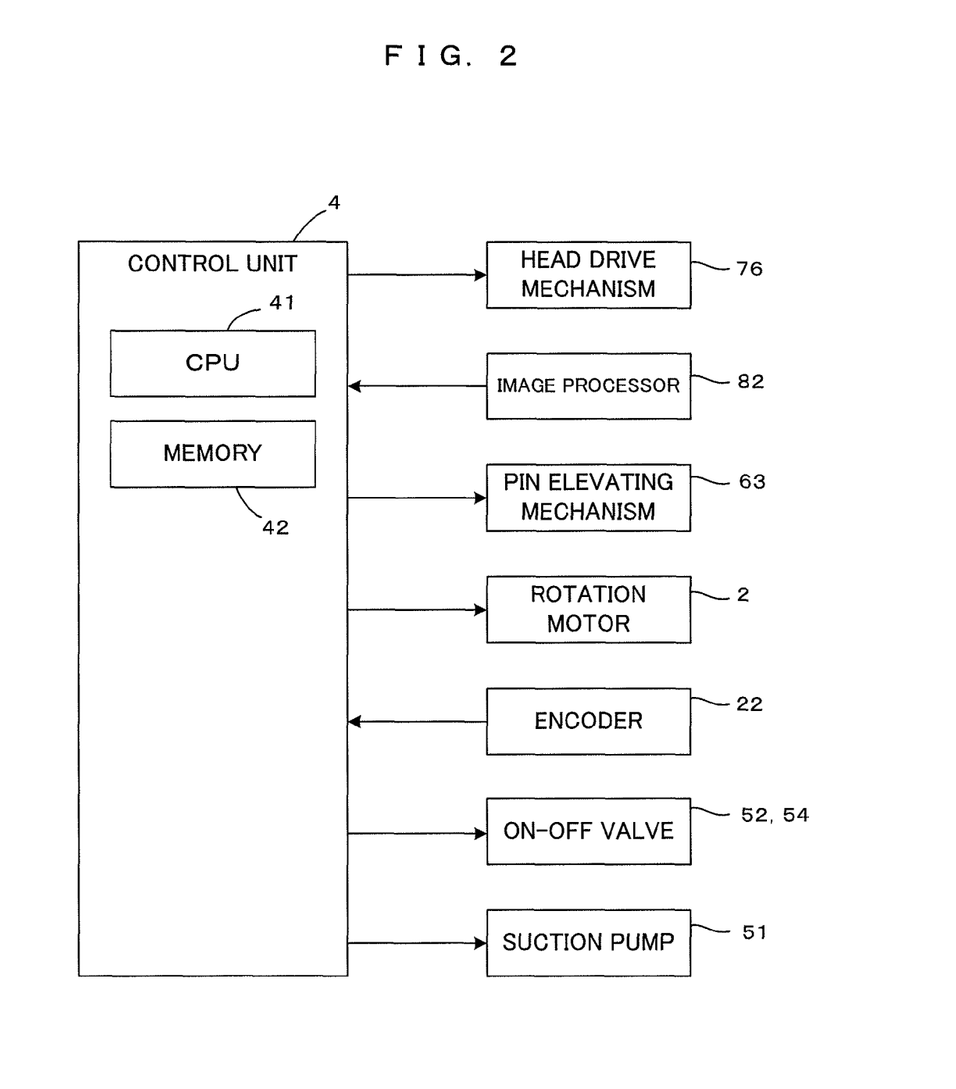
FIG. 2 is a block diagram which shows the electric structure of the apparatus shown in FIGS. 1A and 1B.

FIGS. 1A and 1B are drawings of the substrate processing apparatus according to the first embodiment of the invention, of which FIG. 1A is a plan view of the substrate processing apparatus and FIG. 1B is a side view of the substrate processing apparatus. FIG. 2 is a block diagram which shows the electric structure of the apparatus shown in FIGS. 1A and 1B. In FIGS. 1A and 1B, the three-dimensional coordinate system X-Y-Z is defined in which the X-Y plane is the horizontal plane and the Z-axis direction is the vertical direction. The substrate processing apparatus is for removal of particles (containments) from a surface Wf of a substrate W by abutting an adhesive belt on the surface Wf of the substrate W and thereafter peeling off the adhesive belt.

In this substrate processing apparatus, a rotation shaft 21 of a rotation motor 2 extends toward above in the vertical direction Z, a circular hold table 3 is fixed to the top end of the rotation shaft 21 so that it is possible to support the substrate W at the entire back surface of the substrate on the top surface of the hold table 3. As the rotation motor 2 operates in accordance with a rotate command received from a controller 4 which controls the apparatus as a whole, the hold table 3 rotates about the axis of rotation A0. Further, this embodiment requires use of an encoder 22 (FIG. 2) which measures the amount of rotation (or the angle of rotation, the position of rotation, etc.) of the rotation motor 2 and ensures that the controller 4 accurately calculates the position of rotation of the substrate W held by the hold table 3 based on an output from the encoder 22.

A duct 23 extending all the way to the center of the bottom surface of the hold table 3 in the vertical direction Z is formed in the shaft center of the rotation shaft 21. Meanwhile, inside the hold table 3, there is a duct which extends from the center of the bottom surface of the hold table 3, and from the top end of that duct, a plurality of branch ducts spread out radially in the horizontal direction and a plurality of ducts extend from each branch duct to the top surface of the hold table 3. The duct 31 is formed inside the hold table 3 in this manner and a plurality of holes 32 are provided in a radial arrangement in the top surface of the hold table 3. As the rotation shaft 21 of the rotation motor 2 gets connected to the hold table 3, as shown in FIG. 1B, the top end of the duct 23 gets connected to and becomes contiguous to the duct 31 at the connecting section between the rotation shaft 21 and the hold table 3.

A pressure adjusting mechanism 5 is connected to the bottom end of the duct 23. The pressure adjusting mechanism 5 comprises a negative pressure supply system which supplies a negative pressure to the duct 23 and accordingly sucks and holds the substrate W placed on the top surface of the hold table 3 and a positive pressure supply system which supplies a positive pressure to the duct 23 and accordingly releases the substrate W which is sucked and held. In the negative pressure supply system, a suction pump 51 serving as a negative pressure source is connected to the duct 23 via an on-off valve 52, and as the suction pump 51 operates in response to a control command received from the controller 4 and the on-off valve 52 opens, the suction pump 51 evacuates the duct 23 and the pressure inside the duct 31 leading to the duct 23 is reduced. As a result, the substrate W on the top surface of the hold table 3 is held by suction. On the other hand, in the positive pressure supply system, a nitrogen gas source 53, which is one of utilities for a plant, is connected as a positive pressure source to the duct 23 via an on-off valve 54, and as the on-off valve 54 is opened in accordance with a control command from the controller 4, nitrogen gas is fed under pressure to inside the ducts 23 and 31, thereby releasing the substrate W which is held by suction. Although the configuration according to this embodiment is that the substrate W is held by the hold table 3 utilizing the negative pressure, the holding method is not limited to this.

Figure 4:
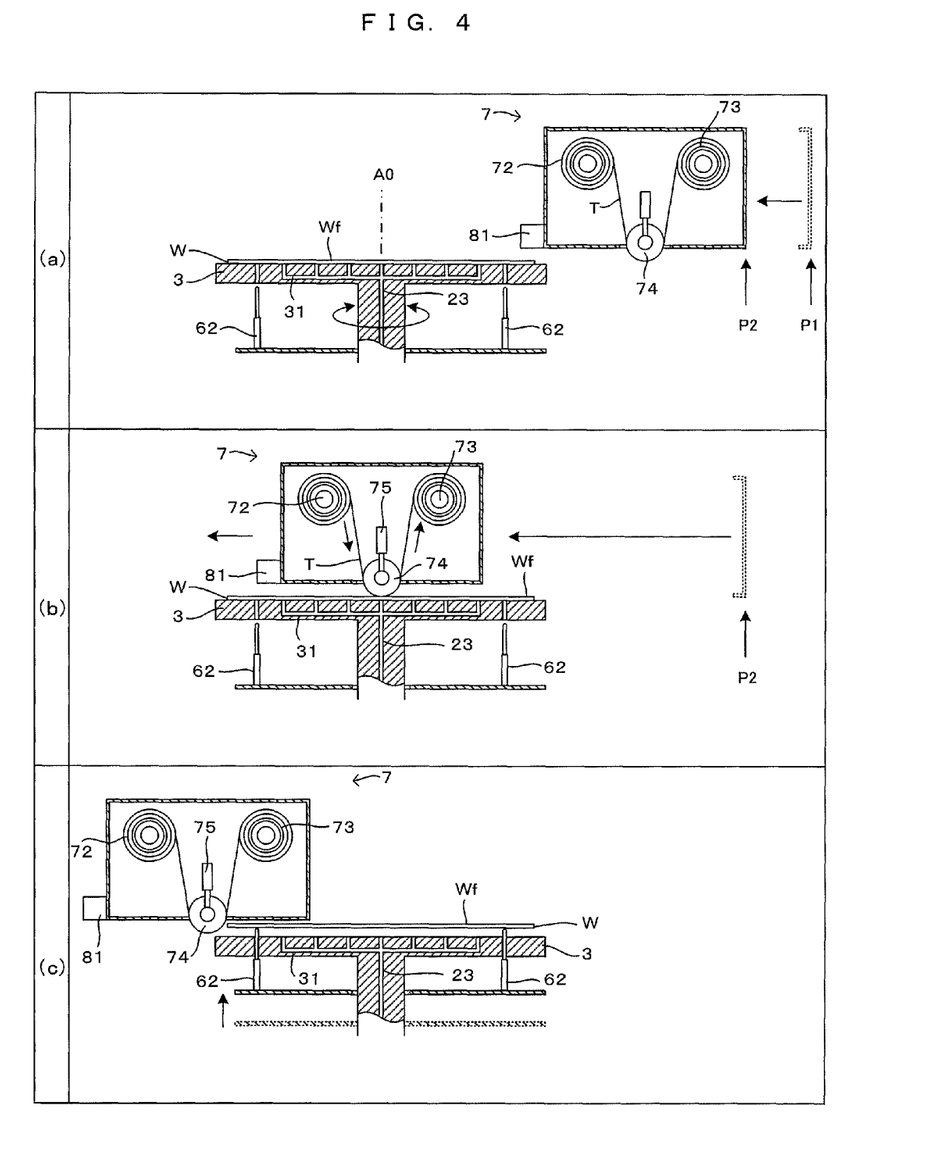
FIG. 4 is schematic diagrams of the operations of the substrate processing apparatus shown in FIG. 1.

Further, a substrate elevating mechanism 6 is provided in this embodiment. The substrate elevating mechanism 6 comprises a ring-like frame 61 which is installed horizontally, a plurality of lift pins 62 which are in a co-centric arrangement with respect to the frame 61 and a pin elevating mechanism 63 such as a solenoid which moves the frame 61 up and down. The plurality of pins 62 are formed so as to face from below a plurality of through holes 33 which are bored in the hold table 3. As the pin elevating mechanism 63 extends in accordance with an ascend command from the controller 4, the frame 61 moves upward, and the lift pins 62 accordingly penetrate the through holes 33 from below, whereby the top ends of the lift pins 62 protrude upward along the vertical direction Z beyond the top surface of the hold table 3 (as shown in FIG. 4C which will be described later). This makes it possible to receive the unprocessed substrate W at a substrate transfer position which is set above the hold table 3 along the vertical direction Z. As the pin elevating mechanism 63 contracts in response to a descend command from the controller 4 after receiving the substrate W, the substrate W is transferred onto the top surface of the hold table 3. In addition, as the pin elevating mechanism 63 extends again in accordance with the ascend command received from the controller 4, the lift pins 62 move up and lift the substrate W held by the hold table 3 up to the substrate transfer position.

A cleaning head 7 is disposed for free reciprocal movement in the direction X, at a position above the hold table 3 along the vertical direction Z. The cleaning head 7 comprises a head main unit 71 which can freely move in the direction X reciprocally, a head drive mechanism 76 (FIG. 2) moves the head main unit 71 in the direction X in accordance a move command from the controller 4. Inside the head main unit 71, an adhesive tape supply part 72 and a tape collection part 73 can be attached to and detached from the head main unit 71 freely. In the condition that they are attached, an adhesive tape T is fed with its adhesive surface faced down from the adhesive tape supply part 72 as shown in FIG. 1B. As described below, the tape collection part 73 winds up the adhesive tape T which was used to remove an adhering foreign matter from the substrate surface Wf.

Beneath the positions of center of rotation 72a and 73a of the adhesive tape supply part 72 and the tape collection part 73 along the vertical direction Z, a pressing member 75 presses toward below the adhesive tape T in such a condition that a pasting/peeling roller 74 remains abutting on the top surface (non-adhesive surface) of the adhesive tape T not yet wound up by the tape collection part 73 after fed from the adhesive tape supply part 72. This makes the adhesive surface of the adhesive tape T wound around the pasting/peeling roller 74 protrude toward below beyond the bottom surface of the head main unit 71. As the head main unit 71 moves in the direction (−X) in accordance with the move command from the controller 4 in this condition, the pasting/peeling roller 74 abuts on the surface Wf of the substrate W held by the hold table 3 via the adhesive tape T, thereby pasting the adhesive tape T. Adhering foreign matters such as particles on the surface Wf of the substrate W therefore stick to the adhesive tape T. Further, immediately after pasted, the adhesive tape T is peeled off along the substrate surface Wf. As the adhesive tape T is peeled off in the direction X in this fashion, the adhering foreign matters on the substrate surface Wf are transferred to the adhesive tape T and removed from the substrate surface Wf. The tape collection part 73 then collects the adhesive tape T which has captured and removed the adhering foreign matters. In this embodiment, as the head main unit 71 moves, the pasting/peeling roller 74 rotates following the surface Wf of the substrate W and so does the adhesive tape supply part 72 as well and the tape collection part 73, too, rotates. However, a motor may be connected to the rotation shafts of the adhesive tape supply part 72 and the tape collection part 73 so as to activity control feeding and collection of the adhesive tape T.

An imager 81 such as a CCD camera is disposed to the side surface of the head main unit 71 facing the direction (−X) so that it is possible to capture from above the image of the surface Wf of the substrate W held by the hold table 3. The image captured by the imager 81 is fed to an image processor 82, and the controller 4 receives image data obtained through predetermined image processing performed by the image processor 82 upon an image signal coming from the imager 81.

The controller 4 comprises a CPU (Central Processing Unit) 41 for various types of computations and a memory 42 for storage of a program for cleaning, various types of data, etc., and as the respective parts of the apparatus are controlled in accordance with the program mentioned above by the controller 4, the adhering foreign matters on the surface Wf of the substrate W are removed in the manner described below, thereby cleaning the substrate W.

Figure 3:
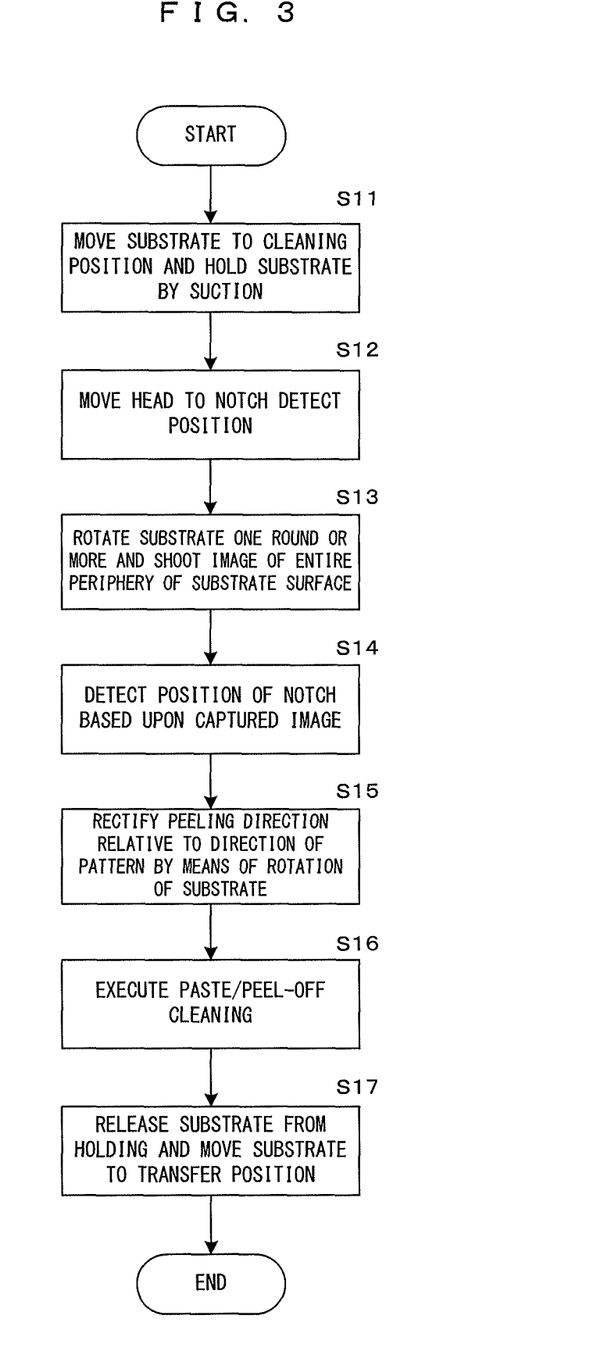
FIG. 3 is a flow chart of the operations performed by the substrate processing apparatus shown in FIG. 1.

FIG. 3 is a flow chart of the operations performed by the substrate processing apparatus shown in FIG. 1. FIG. 4 is schematic diagrams of the operations of the substrate processing apparatus shown in FIG. 1. In this substrate processing apparatus, with the cleaning head 7 set to a standby position P1 which is away from the space above the hold table 3 toward the direction (+X) and the lift pins 62 protruding, a transportation robot (not shown) transports the unprocessed substrate W to the substrate transfer position within the apparatus and the substrate W is placed on the top ends of the lift pins 62 (loading). In response, the controller 4 makes the lift pins 62 descend and the substrate W moves onto the top surface of the hold table 3, and then activates the suction pump 51 and opens the on-off valve 52, whereby the substrate W is sucked at the back surface and accordingly held by the hold table 3 (Step S11). In this way, the substrate W is set to and held at the cleaning position.

At this stage, the direction of a pattern formed on the surface of the substrate W may vary since the substrate W transported by the transportation robot has simply been transferred onto the hold table 3. In the case of the substrates W of this type, patterns are formed such that their positions have a predetermined positional relationship with reference indicators formed in advance in the substrates W. For example, a semiconductor wafer is sliced so as to obtain an appropriate crystal structure to the operations of a semiconductor device, and at a position in an outer peripheral portion of the semiconductor wafer determined by the crystalographic direction, a dent which is usually called a "notch" is formed as a reference indicator. In the surface Wf of the semiconductor wafer, a pattern is formed to have a predetermined positional relationship with the notch. Noting this, the embodiment requires that the steps S12 through S14 are executed, detecting the notch which corresponds to the "reference indicator" of the invention, and the direction of the pattern formed in the surface Wf of the substrate W held by the hold table 3 is identified. The "direction of the pattern" represents a characteristic of the pattern, and in the context of this patent specification, means the direction of elongation of the pattern which is one of the most closely relevant characteristics to peel-off cleaning. This will be described later with reference to FIGS. 5A and 5B.

At the step S12, the controller 4 makes the head drive mechanism 76 move and set the cleaning head 7, which now stays at the standby position P1, to a notch detect position P2. As a result, the imager 81 becomes positioned above the outer periphery of the substrate W held by the hold table 3 as shown in column (a) of FIG. 4. The controller 4 then activates the rotation motor 2, thereby rotating the substrate W one round or more. The imager 81 shoots the substrate during this rotation and the image processor 82 performs predetermined image processing. The resultant image data which represent the image of the periphery of the substrate surface Wf are stored in the memory 42 in association with the rotational position (or the angle of rotation) of the substrate W, and the image of the entire periphery of the substrate surface Wf is obtained (Step S13).

Since thus obtained image of the entire periphery contains the image representing the notch, the controller 4 detects the position of the notch based upon the image data stored in the memory 42 (Step S14). It is thus possible for the controller 4 to accurately grasp the posture of the substrate W which is held by the hold table 3, i.e., the azimuth of the notch in the horizontal direction in which the substrate W is held, and to precisely identify the direction of the pattern at the time of detection of the notch position based upon the posture. The method of detecting the notch position may be a conventional method which is widely used and therefore will not be described.

At the next step S15, the controller 4 makes the substrate W rotate about the axis of rotation A0 by the amount of rotation which corresponds to the position of the notch, thereby rectifying the direction of the pattern to the peeling direction X. In this embodiment, the substrate W is positioned so that the direction of the pattern becomes approximately parallel to the peeling direction X. Following this, as shown in a column (b) of FIG. 4, the controller 4 controls the head drive mechanism 76 so that the cleaning head 7 moves from the notch detect position P2 toward the direction (−X) and peel-off cleaning is carried out using the adhesive tape T (Step S16).

As the pasting/peeling roller 74 of the cleaning head 7 moves passed the surface Wf of the substrate W and peel-off cleaning completes as shown in a column (c) of FIG. 4, the controller 4 stops moving the cleaning head 7. Further, the controller 4 stops operating the suction pump 51 and switches the on-off valves 52 and 54 respectively to "CLOSE" and "OPEN," thereby releasing the substrate W which is held by suction, and then makes the pin elevating mechanism 63 move up the lift pins 62. In consequence, the substrate W which has been cleaned by peel-off cleaning is lifted up from the hold table 3 to the transfer position (Step S17) and transported to the next substrate processing apparatus by the transportation robot.

After the substrate W exited in this manner, the controller 4 returns the cleaning head 7 back to the standby position P1, waits for transportation of the next substrate W to the transfer position and repeats the series of processing steps described above.

According to the first embodiment, prior to peel-off cleaning of the surface Wf of the substrate W using the adhesive tape T, the substrate W is rotated based upon the direction of the pattern at the time of detection of the notch position and the relationship between the direction of the pattern and the peeling direction X relative to each other is rectified so that the direction of the pattern becomes parallel to the peeling direction X as described above. Hence, it is possible to stably remove the adhering foreign matters such as particles at an excellent removal rate while suppressing damage to the pattern. This is considered to be owing to the following.

Figure 5A:
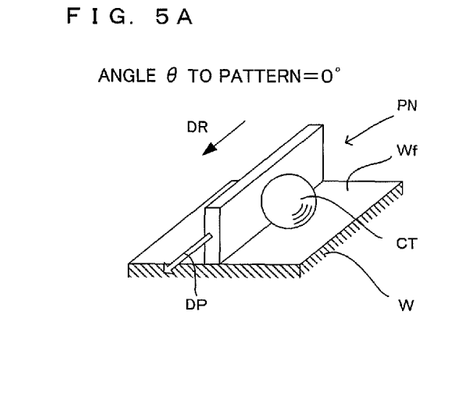
FIGS. 5A and 5B are schematic diagrams of the relation between the peeling direction relative to a pattern and particles.
Figure 5B:
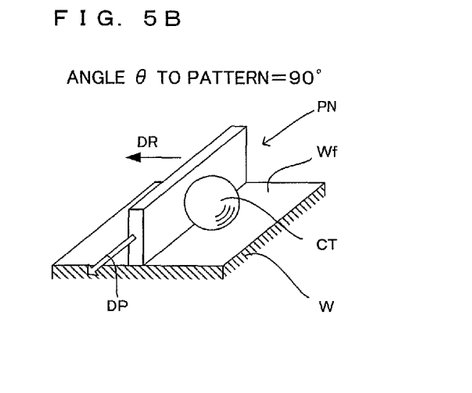

FIGS. 5A and 5B are schematic diagrams of the relation between the peeling direction relative to a pattern and particles. For example, a number of patterns PN which may typically be lines and spaces are formed in the surface Wf of the substrate W such as a semiconductor substrate and a glass substrate for liquid crystal as shown in FIGS. 5A and 5B, and during paste/peel-off cleaning of adhering foreign matters CT such as particles from the surface Wf of the substrate W, these patterns PN may become obstacles. Particularly when the peeling direction (denoted by the solid arrow in FIG. 5B) DR for peeling an adhesive member such as the adhesive tape T abutting on the substrate surface Wf is orthogonal to the direction of elongation (denoted by the white arrow) DP of the pattern PN, as the pattern PN, as if it were wall, stands against the destination of the adhering foreign matter CT through the peeling motion of the adhesive member. For removal of the adhering foreign matter CT therefore, it is necessary to move the adhering foreign matter CT across the pattern PN. In contrast, when the peeling direction DR is parallel to the direction DP of the pattern PN as shown in FIG. 5A, it is possible to move the adhering foreign matter CT along the pattern PN since the pattern PN never obstructs the adhering foreign matter CT which is moving. Hence, the closer to zero the angle θ (hereinafter "the angle to pattern") of the peeling direction DR relative to the direction DP of the pattern PN becomes from 90 degrees, the higher the rate of removal of the adhering foreign matter CT becomes and the smaller the damage to the pattern PN becomes.

Figure 6A:
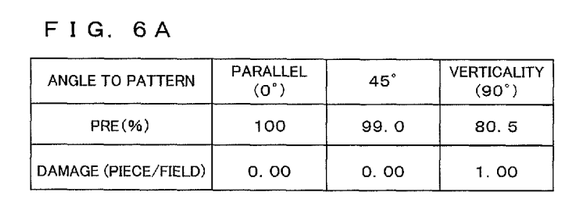
FIGS. 6A and 6B are diagrams of the result of the particle removal efficiency and the number of damaged patterns corresponding to angles to pattern.

Based upon the consideration above, paste/peel-off cleaning of a substrate having lines and spaces was conducted while setting the angle θ to three levels (0 degree, 45 degrees and 90 degrees), and the result (FIG. 6A) showed a similar trend to the above. A plurality of substrates described below was prepared, using the adhesive member (which was available under the trade name of "Chukoh Flo Fluoroplastic Adhesive Tape ASF-110FR" from Chukoh Chemical Industries, Ltd.), paste/peel-off cleaning was conducted at the three levels of the angle θ described above:

<Substrate>

Material and Plane Size of Substrate: Silicon substrate of H30×W20 [mm]

Average Thickness of Substrate: 0.75 [mm]

Height of Pattern (Line): 152 [mm]

The particle removal efficiency (PRE) and the number of damaged patterns were measured.

Figure 6B:
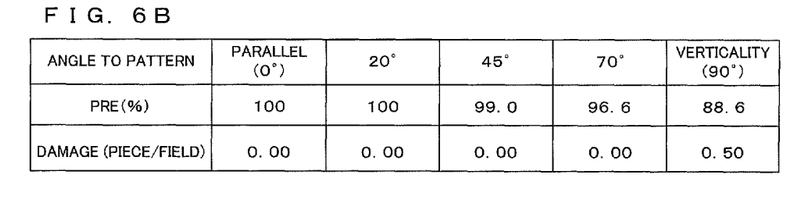

In addition, for the purpose of studying the influence of the angle θ upon the particle removal efficiency and suppression of damage in greater detail, the angle θ was varied more to five levels (0 degree, 20 degrees, 45 degrees, 70 degrees and 90 degrees) and paste/peel-off cleaning was conducted at each angle. At each angle, eight fields were observed, and the particle removal efficiency and the number of damaged patterns were measured. FIG. 6B summarizes the result.

As understood from the consideration above and the actual measurement results, rectification of the relationship between the peeling direction and the direction of the pattern important in improving the removal rate and the damage suppression characteristic. That is, it is desirable to peel off the adhesive member in a direction which is not at right angle to the direction of the pattern along the surface of the substrate. Further, it is preferable to adjust the angle θ, which corresponds to "the angle of the peeling direction of the adhesive member with respect to the direction of the pattern," of the invention to 70 degrees or smaller, and more preferably to 20 degrees or smaller.

Further, according to the embodiment above, the notch is detected while holding the substrate W by the hold table 3, and based upon the notch detect position, the relationship between the peeling direction and the direction of the pattern is rectified. In short, since the series of the processing steps are carried out while the hold table 3 holds the substrate W, it is possible to stably perform paste/peel-off cleaning of the substrate in a short tact time.

Thus, in the embodiment above, the imager 81 serves as "the detection section" of the invention. Meanwhile, the cleaning head 7 corresponds to "the cleaner" of the invention. The holding stage 3 corresponds to "the substrate holder" of the invention and the rotation motor 2 which rotates the holding stage 3 corresponds to "the rotator" of the invention.

By the way, although the first embodiment above is directed to application of the invention to a substrate processing apparatus which performs the series of the processing steps while holding the substrate W by the hold table 3, the invention is not limited only to this application. Rather, the invention is applicable also to a substrate processing apparatus which is a combination (and therefore sometimes called a "substrate processing system") of at least one cleaning unit for paste/peel-off cleaning and other processing units (such as a transportation robot and an alignment unit). In the following, a substrate processing apparatus comprising four cleaning units and one alignment unit will be described as an example.

Figure 7:
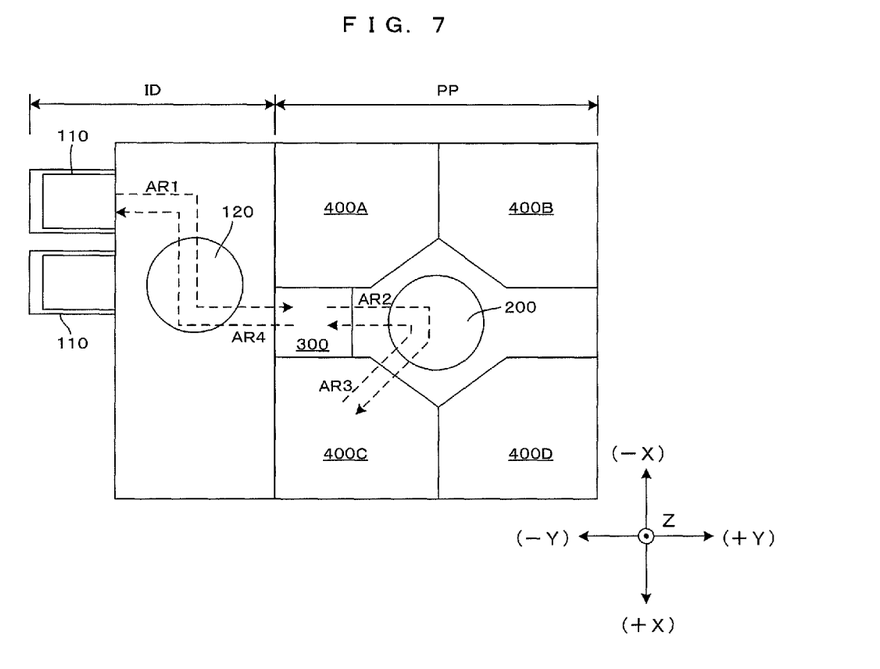
FIG. 7 is a drawing which shows a second embodiment of the substrate processing apparatus according to the invention.
Figure 8:
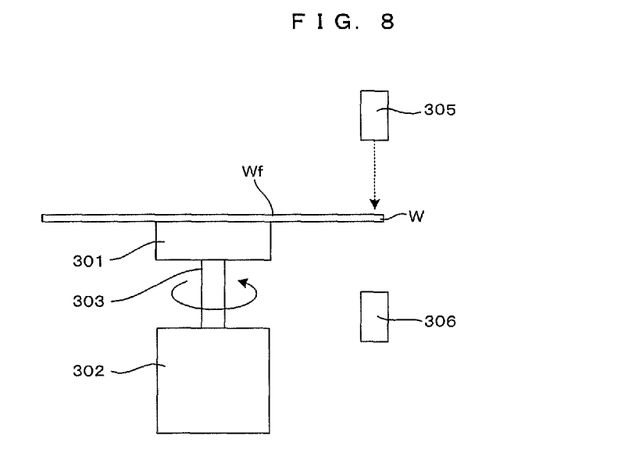
FIG. 8 is a drawing which shows the structure of the alignment section which the substrate processing apparatus of FIG. 7 comprises.
Figure 9:
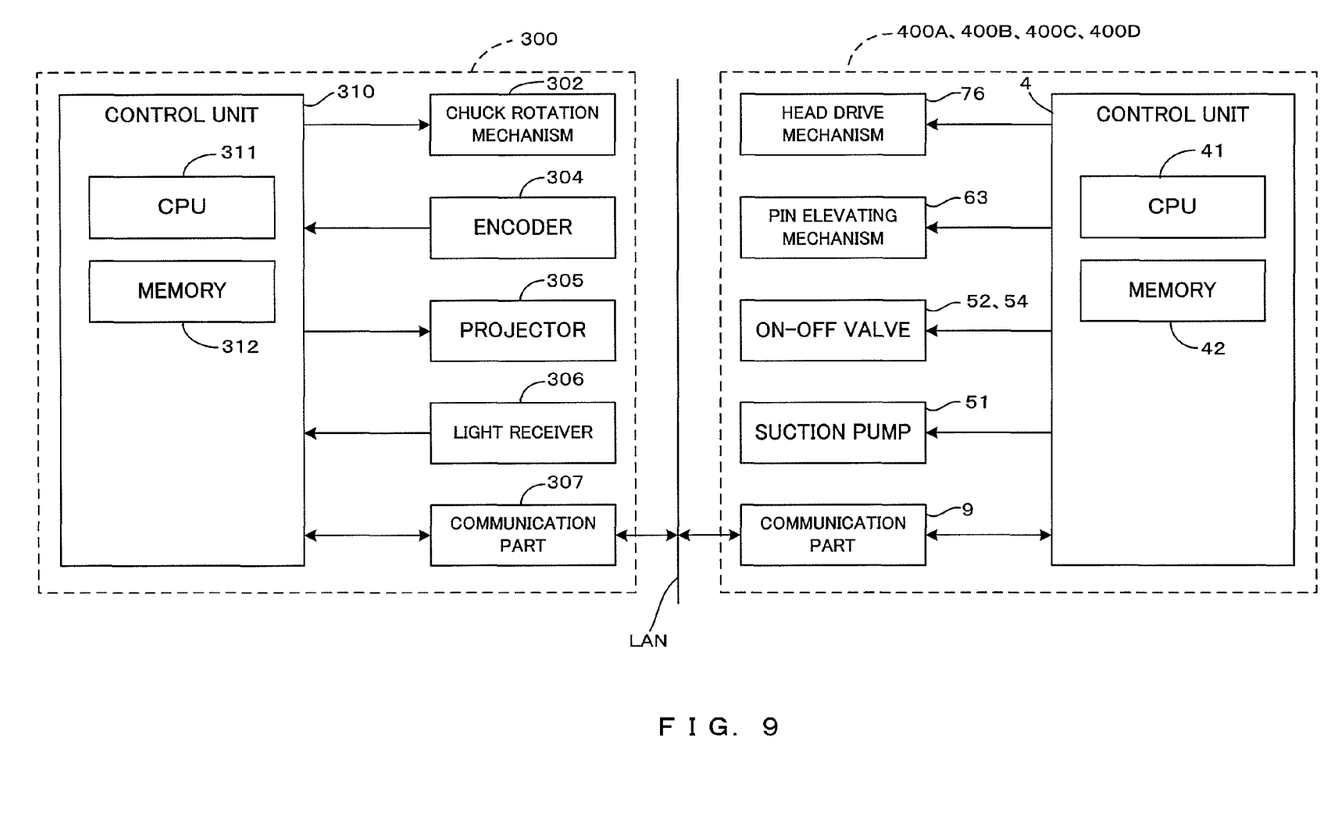
FIG. 9 is block diagram which partially shows the electric structure of the substrate processing apparatus of FIG. 7.

FIG. 7 is a drawing which shows a second embodiment of the substrate processing apparatus according to the invention. FIG. 8 is a drawing which shows the structure of the alignment section which the substrate processing apparatus of FIG. 7 comprises. Further, FIG. 9 is block diagram which partially shows the electric structure of the substrate processing apparatus of FIG. 7. In the second embodiment, the substrate W held in a container 110 is taken out, and after paste/peel-off cleaning of the surface Wf of the substrate W, the substrate W is returned back to the container 110.

In this substrate processing apparatus, an indexer section ID is disposed on the upstream side (the left-hand side in FIG. 7), and on the downstream side to the indexer section ID (the right-hand side in FIG. 7), a process section PP is disposed which performs paste/peel-off cleaning of the surface Wf of the substrate W.

In the indexer section ID, two containers 110 for storage of the substrates W are disposed side by side in the direction X, and a substrate transportation robot 120 which has already been widely used moves in the direction X of arrangement of the containers, receiving the pre-cleaning substrate W from one container 110 and transferring it to the process section PP or receiving the post-cleaning substrate W from the process section PP and storing the substrate W back into the container 110.

In the process section PP which is on the (+Y) side to the indexer section ID, a center robot 200 is disposed approximately at the center. The center robot 200 may have the same structure as that of a conventional substrate transportation robot which has been widely used, and serves as "the substrate transporter" of the invention. An alignment unit 300 and cleaning units 400A through 400D are disposed around the center robot 200. The basic structure of the cleaning units 400A through 400D is the same as that of the substrate processing apparatus according to the first embodiment except that they do not rotate the hold table 3 and they do not capture the image of the notch, and therefore, the structure of the cleaning units 400A through 400D will not be described. Meanwhile, the alignment unit 300 is equipped with a function of detecting the position of the notch of the substrate W and adjusting the relationship in terms of direction. The structure of the alignment unit 300 is as described below.

As shown in FIG. 7, the alignment unit 300 is disposed next to the indexer section ID. Hence, both the substrate transportation robot 120 and the center robot 200 can access the alignment unit 300, and the substrate W from the container 110 is transported to the respective cleaning units 400A through 400D via the substrate transportation robot 120, the alignment unit 300 and the center robot 200 and the substrate W after processed is returned back to the container 110 via the opposite route.

The alignment unit 300 comprises a spin chuck 301 as shown in FIG. 8 and holds the substrate W at the center of the bottom surface of the substrate W which remains horizontal with its top surface Wf directed toward above, as shown in FIG. 8. A rotation shaft 303 of a chuck rotation mechanism 302 is linked to the spin chuck 301, and in accordance with a rotate command from a control unit 310 which controls the alignment unit 300 as a whole, the chuck rotation mechanism 302 rotates the spin chuck 301. Further, an encoder 304 is connected to the rotation shaft 303 of the chuck rotation mechanism 302 so that a signal representing the amount of rotation, the position of rotation or the like of the substrate W is outputted to the control unit 310 from the encoder 304.

A light projector 305 is disposed along the vertical direction Z above the periphery of the substrate W which is held by the spin chuck 301, whereas a light receiver 306 is disposed below along the vertical direction Z. At the timing that the notch of the substrate W (not shown) comes between the light projector 305 and the light receiver 306, the light receiver 306 receives light from the light projector 305 and outputs a notch detect signal to the control unit 310.

In the control unit 310 receiving the notch detect signal, a CPU 311 controls the chuck rotation mechanism 302 as described below in accordance with a program stored in advance within a memory 312, thereby adjusting the relationship between the peeling direction and the direction of the pattern relative to each other.

Denoted at 307 in FIG. 9 is a communication part connected to a local area network, LAN, which connects the respective sections of the substrate processing apparatus to each other. The communication part 307 is capable of transferring and receiving various types of data and the like to and from a host computer which controls the entire substrate processing apparatus, communication parts 9 of the cleaning units 400A through 400D, etc.

Figure 10:
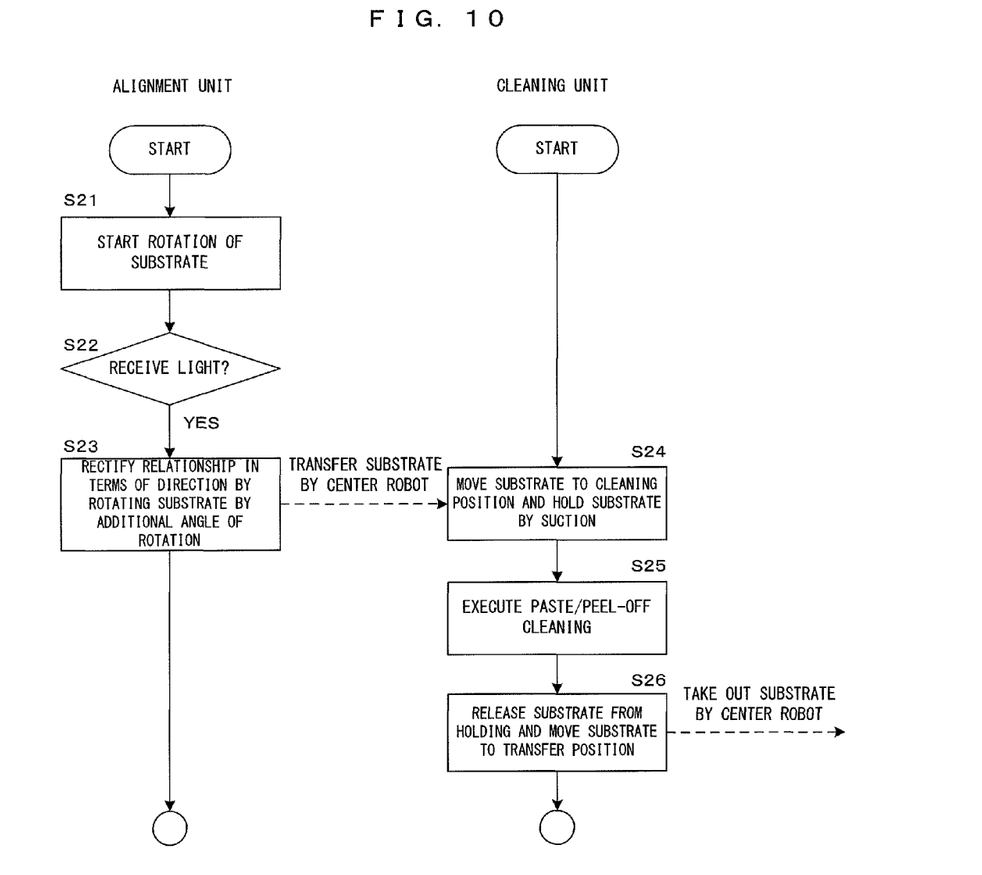
FIG. 10 is a flow chart of the operations of the substrate processing apparatus shown in FIG. 7.

Next, the operations of the substrate processing apparatus having the structure described above will be described with reference to FIGS. 7 and 10. FIG. 10 is a flow chart of the operations of the substrate processing apparatus shown in FIG. 7. In this substrate processing apparatus, as indicated by the dotted line arrow AR1 in FIG. 7, the substrate transportation robot 120 transports the unprocessed substrate W housed inside the container 110 to the spin chuck 301 of the alignment unit 300. During the transportation, the substrate transportation robot 120 places the substrate W on the spin chuck 301 while coinciding the center of rotation of the substrate W with that of the spin chuck 301 (loading). In response, the control unit 310 of the alignment unit 300 causes the chuck rotation mechanism 302 to start rotating the substrate W while holding the substrate W by the spin chuck 301 (Step S21). At the start of rotation, the control unit 310 does not know the direction of the pattern formed in the surface Wf of the substrate W yet. When the light receiver 306 outputs the notch detect signal ("YES" at Step S22), the control unit 310 recognizes that the notch is located between the light projector 305 and the light receiver 306 and therefore the direction of the pattern. Further, since the relationship between the positions of the light projector 305 and the light receiver 306 and those of the respective cleaning units 400A through 400D is fixed in advance, at the time that the notch detect signal is detected, the relationship between the direction of the pattern formed in the surface Wf of the substrate W and peeling direction at the destination of the substrate W (i.e., in one of the cleaning units 400A through 400D) becomes clear. Noting this, the control unit 310 further rotates the substrate W which is located between the light projector 305 and the light receiver 306 by an additional angle of rotation, thereby adjusting the direction of the pattern to a suitable direction for paste/peel-off cleaning at the destination and rectifying the relationship in terms of direction (Step S23). The peeling directions inside the cleaning units 400A through 400D may sometimes be different from each other, and hence, suitable additional angles of rotation to the respective cleaning units 400A through 400D may be stored in the memory 312, and rectification described above may be executed after retrieving the additional angle of rotation for the destination so that the relationship between the direction of the pattern and the peeling direction is rectified and the direction of the pattern becomes parallel to the peeling direction in the same manner as the first embodiment.

At the stage of transportation to the cleaning units 400A through 400D by the center robot 200, the control unit 310 releases the substrate from the spin chuck 301. The center robot 200 receives the substrate W placed on the spin chuck 301, transports it to the designated cleaning unit which may for example be the cleaning unit 400C as denoted by the dotted line arrow AR2 in FIG. 7, passes it to the transfer position within the cleaning unit 400C, and places it on the lift pins 62.

In the cleaning unit 400C to which the substrate W has been transferred, the control unit 4 controls the respective sections of the unit so that paste/peel-off cleaning is executed. That is, the control unit 4 makes the lift pins 62 descend, thereby moving the substrate W onto the top surface of the hold table 3, and then activates the suction pump 51 and opens the on-off valve 52, whereby the substrate W is sucked at its back surface and held by suction by the holding table 3 (Step S24). As a result, the substrate W is positioned at the cleaning position. According to the second embodiment, since the relationship between the direction of the pattern and the peeling direction X has already been rectified by the alignment unit 300, paste/peel-off cleaning is immediately executed (Step S25). In other words, the control unit 4 makes the head drive mechanism 76 move the cleaning head 7 toward the direction (−X) from the standby position P1, and paste/peel-off cleaning is carried out using the adhesive tape T.

As the pasting/peeling roller 74 of the cleaning head 7 moves passed the surface Wf of the substrate W and paste/ peel-off cleaning completes, the control unit 4 stops moving the cleaning head 7. Further, the control unit 4 stops operating the suction pump 51 and switches the on-off valves 52 and 54 respectively to "CLOSE" and "OPEN," thereby releasing the substrate W which is held by suction, and then makes the pin elevating mechanism 63 move up the lift pins 62. In consequence, the substrate W treated through paste/peel-off cleaning is lifted up to the transfer position from the hold table 3 (Step S26).

The center robot 200 receives the processed substrate W positioned to the transfer position and places it onto the spin chuck 301 of the alignment unit 300 as denoted by the dotted line arrow AR3 in FIG. 7. The substrate transportation robot 120 receives the substrate W and returns it back to the container 110 as denoted by the dotted line arrow AR4 in FIG. 7.

As described above, according to the second embodiment, prior to paste/peel-off cleaning at the cleaning units 400A through 400D, the alignment unit 300 rotates the substrate W by a predetermined angle from its angle at the timing of the detection of the notch such that the direction of the pattern becomes parallel to the peeling direction X, whereby the relationship between the direction of the pattern and the peeling direction relative to each other is rectified as in the first embodiment. It is therefore possible to remove an adhering foreign matter such as particles at an excellent removal rate while suppressing damage to the pattern.

In the second embodiment, the spin chuck 301 corresponds to "the rotary holder" of the invention, whereas the light projector 305 and the light receiver 306 correspond to "the detector" of the invention and form "the detection section" of the invention.

Further, in the second embodiment, the alignment unit 300 rectifies the relationship in terms of direction for the next substrate W during paste/peel-off cleaning at the cleaning units 400A through 400D, and therefore, it is possible to improve the throughput of the entire apparatus.

The invention is not limited to the embodiment above and may be modified in various manners besides the embodiment above to the extent not deviating from the object of the invention. For example, although the peeling direction of the adhesive tape T is fixed and the substrate W is rotated such that the direction of the pattern becomes parallel to the peeling direction, thereby rectifying the relationship in terms of direction according to the embodiment described above, a head rotation mechanism may revolve the cleaning head 7 about the center of rotation A0 of the substrate W to thereby change the peeling direction and achieve rectification described above. Of course, rectification described above may be attained by combining rotation of the substrate W and change of the peeling direction.

In addition, although the position of the notch is detected by the so-called transmission method using the light projector 305 and the light receiver 306 according to the second embodiment, the position of the notch may be detected by the reflection method instead. The reflection method is applicable also to the first embodiment. The notch detection method used in the first embodiment may be applied to the second embodiment.

Further, although detection of the notch and adjustment of the direction of the pattern relative to the peeling direction by means of rotation of the substrate is performed while holding the substrate by the spin chuck 301 in the second embodiment, the unit for detection of the notch may be separate from the unit for adjustment of the direction of the pattern. For instance, in the second embodiment, the alignment unit may be replaced with a notch detection unit which performs notch detection alone, information regarding the position of the notch detected by the notch detection unit may be provided to the cleaning unit via LAN, the local area network, and the cleaning unit may execute paste/peel-off cleaning after adjustment of the direction of the pattern.

Further, although the embodiments above require use of the notch formed in the outer periphery area of the substrate W as "the reference indicator" of the invention, something formed in the substrate W in a predetermined positional relationship with the pattern such as a number or particular pattern given to or formed in the substrate W may be used as "the reference indicator" of the invention.

Further, although paste/peel-off cleaning is performed using the adhesive tape wound around the pasting/peeling roller 74 in the embodiments above, paste/peel-off cleaning is not limited only to this. The invention is applicable also to an apparatus and a method for paste/peel-off cleaning using an adhesive sheet as the adhesive member, for example. In addition, the invention is applicable to a configuration that a mechanism for pasting the adhesive member to the substrate surface is separate from a mechanism for peeling the adhesive member off along the substrate surface.

The invention is applicable to a substrate processing apparatus for and a substrate processing method of paste/peel-off cleaning of a surface of a substrate, such as a semiconductor wafer, a glass substrate for photo mask and a glass substrate for liquid crystal display.

In the invention, for instance, the angle of the peeling direction of the adhesive member with respect to the direction of the pattern may be set to 70 degrees or smaller.

Further, for instance, the substrate processing apparatus may further comprises: a detection section which detects the reference indicator; and a controller which executes at least one of change of the peeling direction of the adhesive member and rotation of the substrate based upon the direction of the pattern at the time of detection of the reference indicator by the detection section, thereby adjusting the angle of the peeling direction of the adhesive member with respect to the direction of the pattern. As these elements are added, it is possible to set the peeling direction of the adhesive member to a direction which is not at right angle to a direction of the pattern without fail.

Although the detection section which detects the reference indicator may have any desired structure, for instance, the detection section may detect the reference indicator in a condition that the substrate holder holds the substrate. In this case, in a condition that the substrate holder holds the substrate, the reference indicator is detected, the peeling direction is rectified, and the peeling operation is executed. Therefore, it is possible to stably clean the substrate in a short tact time. In this instance, the substrate holder may rotate by the rotator so that the substrate held by the substrate holder rotates and the angle of the peeling direction of the adhesive member with respect to the direction of the pattern is adjusted. This configuration makes it possible to fix the peeling direction at the cleaner and simplify the structure of the cleaner. Of course, the cleaner may be structured so that the peeling direction of the adhesive member can be changed freely, the peeling direction of the adhesive member may be changed and the angle of the peeling direction of the adhesive member with respect to the direction of the pattern may be adjusted.

Further, for instance, the substrate holder and detection section may be separate from each other, a substrate transporter may transports the substrate to the substrate holder from the detection section. When this configuration is used, the freedom of design of the respective parts of the apparatus increases, it is possible for the detection section to detect the reference indicator of the subsequent substrate while the substrate held by the substrate holder is being cleaned. This makes it possible to improve the throughput of the apparatus as a whole.

In the event that the detection section is separate from the substrate holder, the detection section may comprise a rotary holder which holds and rotates the substrate and a detector which detects the reference indicator of the substrate held by the rotary holder, and prior to transportation of the substrate to the substrate holder by the substrate transporter, the substrate held by the rotary holder may rotate and the angle of the peeling direction of the adhesive member with respect to the direction of the pattern may be adjusted. It is thus possible to rectify in advance the peeling direction before transportation to the substrate holder.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus comprising:
    a substrate holder which holds a substrate having a pattern formed in a surface of the substrate in a predetermined positional relationship with a reference indicator of the substrate;
    a cleaner which abuts an adhesive member on the surface of the substrate which is held by the substrate holder and peels off the adhesive member along the surface of the substrate in a peeling direction which is not at right angle to a direction of the pattern, thereby cleaning the surface of the substrate;
    a detection section which detects the reference indicator; and
    a controller which executes at least one of change of the peeling direction of the adhesive member and rotation of the substrate based upon a direction of the pattern at the time of detection of the reference indicator by the detection section, thereby adjusting the angle of the peeling direction of the adhesive member with respect to the direction of the pattern.

2. The substrate processing apparatus of claim 1, wherein an angle of the peeling direction with respect to the direction of the pattern is 70 degrees or smaller.

3. The substrate processing apparatus of claim 1, wherein the detection section detects the reference indicator in a condition that the substrate holder holds the substrate.

4. The substrate processing apparatus of claim 3, further comprising a rotator which rotates the substrate holder,
    wherein the cleaner fixes the peeling direction of the adhesive member, and
    the controller controls the rotator so that the substrate held by the substrate holder rotates and the angle of the peeling direction of the adhesive member with respect to the direction of the pattern is adjusted.

5. The substrate processing apparatus of claim 3, wherein the cleaner is capable of freely changing the peeling direction of the adhesive member, and
    the controller controls the cleaner so that the peeling direction of the adhesive member is changed and the angle of the peeling direction of the adhesive member with respect to the direction of the pattern is adjusted.

6. The substrate processing apparatus of claim 1, further comprising a substrate transporter which transports the substrate to the substrate holder from the detection section.

7. The substrate processing apparatus of claim 6, wherein the detection section comprises a rotary holder which holds and rotates the substrate and a detector which detects the reference indicator of the substrate held by the rotary holder, and
    prior to transportation of the substrate to the substrate holder by the substrate transporter, the controller controls the rotary holder so that the substrate held by the rotary holder rotates and the angle of the peeling direction of the adhesive member with respect to the direction of the pattern is adjusted.

8. The substrate processing apparatus of claim 1, wherein the pattern has lines and spaces.

9. The substrate processing apparatus of claim 8, wherein the direction of the pattern is a direction of elongation of the pattern.

10. The substrate processing apparatus of claim 1, wherein the cleaner comprises a supply part which feeds the adhesive member, a collection part which winds up the adhesive member, a roller which abuts the adhesive member on the surface of the substrate, and a main unit,
    the supply part and the collection part are inside the main unit, and
    the roller protrudes toward a direction below the bottom surface of the main unit.

11. The substrate processing apparatus of claim 10, wherein the detection section is disposed at the side surface of the main unit.

12. A substrate processing method comprising the steps of:
    holding a substrate which has a pattern formed in a surface of the substrate in a predetermined positional relationship with a reference indicator of the substrate by a substrate holder;
    abutting an adhesive member of a cleaner on the surface of the substrate held by the substrate holder;
    peeling the adhesive member along the surface of the substrate in a peeling direction which is not at right angle to a direction of the pattern, thereby cleaning the surface of the substrate;
    detecting the reference indicator with a detection section; and
    executing with a controller at least one of change of the peeling direction of the adhesive member and rotation of the substrate based upon the direction of the pattern at the time of detection of the reference indicator by the detection section, thereby adjusting the angle of the peeling direction of the adhesive member with respect to the direction of the pattern.

* * * * *